United States Patent
Tsujimoto et al.

(10) Patent No.: US 10,412,848 B2
(45) Date of Patent: Sep. 10, 2019

(54) POWER SUPPLY DEVICE

(71) Applicant: TDK CORPORATION, Tokyo (JP)

(72) Inventors: Kengo Tsujimoto, Tokyo (JP); Kouji Utsui, Tokyo (JP); Akira Ikezawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 70 days.

(21) Appl. No.: 15/408,761

(22) Filed: Jan. 18, 2017

(65) Prior Publication Data
US 2017/0208702 A1 Jul. 20, 2017

(30) Foreign Application Priority Data
Jan. 20, 2016 (JP) .................. 2016-009036

(51) Int. Cl.
| | |
|---|---|
| H05K 7/14 | (2006.01) |
| H02M 1/44 | (2007.01) |
| H02M 7/00 | (2006.01) |
| H02M 7/217 | (2006.01) |
| H05K 7/20 | (2006.01) |

(52) U.S. Cl.
CPC ............ *H05K 7/1432* (2013.01); *H02M 1/44* (2013.01); *H02M 7/003* (2013.01); *H02M 7/217* (2013.01); *H05K 7/209* (2013.01); *H05K 7/20436* (2013.01)

(58) Field of Classification Search
CPC .. H05K 7/1432; H05K 7/209; H05K 7/20436; H02M 7/217; H02M 7/003; H02M 1/44
USPC .................................................. 361/714–722
See application file for complete search history.

(56) References Cited

U.S. PATENT DOCUMENTS

| | | | |
|---|---|---|---|
| 6,320,776 B1* | 11/2001 | Kajiura ................. | H02M 7/003 361/709 |
| 2002/0089825 A1* | 7/2002 | Sasaki ..................... | G06F 1/20 361/702 |

(Continued)

FOREIGN PATENT DOCUMENTS

| | | |
|---|---|---|
| CN | 1364705 A | 8/2002 |
| CN | 104080312 A | 10/2014 |

(Continued)

OTHER PUBLICATIONS

Jun. 13, 2017 Search Report issued in European Patent Application No. 17152255.0.

(Continued)

*Primary Examiner* — Anthony M Haughton
*Assistant Examiner* — Yahya Ahmad
(74) *Attorney, Agent, or Firm* — Oliff PLC (57) ABSTRACT

A power supply device 1 includes a main circuit board 20, a power component 22 connected to the main circuit board 20, a filter component 24 connected to the main circuit board 20, and a casing 10 which houses the main circuit board 20, the power component 22, and the filter component 24. The casing 10 includes a base plate 11 which includes a flat surface 11a in which a fin 14 for heat dissipation is provided on a bottom-surface side, and a protruding part 15 which protrudes from the flat surface toward the fin. The power component 22 and the main circuit board 20 are placed on the flat surface, and the filter component 24 is housed in the protruding part 15.

3 Claims, 8 Drawing Sheets

(56) References Cited

U.S. PATENT DOCUMENTS

| | | | |
|---|---|---|---|
| 2008/0266811 A1* | 10/2008 | Yamada | F24F 1/12 |
| | | | 361/720 |
| 2009/0057006 A1 | 3/2009 | Kishibata et al. | |
| 2013/0322021 A1* | 12/2013 | Ohoka | H05K 9/0007 |
| | | | 361/714 |
| 2014/0028029 A1* | 1/2014 | Jochman | G05F 1/02 |
| | | | 290/1 A |
| 2014/0321065 A1* | 10/2014 | Nishimura | H05K 1/0203 |
| | | | 361/722 |
| 2015/0145469 A1* | 5/2015 | You | H02J 7/0042 |
| | | | 320/107 |

FOREIGN PATENT DOCUMENTS

| | | |
|---|---|---|
| DE | 10 2014 202 841 A1 | 10/2014 |
| JP | 2000-278936 A | 10/2000 |
| JP | 2002-205610 A | 7/2002 |
| JP | 2011-234559 A | 11/2011 |
| JP | 2014-44007 A | 3/2014 |

OTHER PUBLICATIONS

Translation dated Jun. 18, 2019 Office Action issued in Japanese Patent Application No. 2016-009036.

* cited by examiner

POWER SUPPLY DEVICE

TECHNICAL FIELD

The present invention relates to a power supply device.

BACKGROUND

A power supply device in which a plurality of electronic components are mounted onto a board, suffers from a problem associated with a noise generated from the electronic components in some cases. Thus, various kinds of configurations for reducing influences of noise are discussed. Further, some electronic components generate heat to have a high temperature, and so, also a way of placement of a heat dissipating means for cooling electronic components in a power supply device is discussed (refer to Japanese Unexamined Patent Publication No. 2000-278936, for example).

SUMMARY

While a demand for miniaturization of a power supply device is increasing in recent years, it is not easy to make heat dissipation from mounted electronic components and noise reduction, compatible with miniaturization of a device.

The present invention has been made in view of the above-described matters, and it is an object of the present invention to provide a power supply device which can achieve heat dissipation from mounted electronic components, reduction of influences of noise generated in the device, and miniaturization of the device.

In order to achieve the object, a power supply device according to an embodiment of the present invention includes: a circuit board; a power component and a filter component configured to be connected to the circuit board; and a casing configured to house the circuit board, the power component, and the filter component, wherein the casing includes a base plate including a flat surface in which a fin for heat dissipation is provided on a bottom-surface side, and a protruding part which protrudes from the flat surface toward the fin, and the power component and the circuit board are placed on the flat surface, and the filter component is housed in the protruding part.

As in the above-described power supply device, the power component which can possibly be a noise source and is mounted onto the circuit board, is placed on the flat surface of the base plate in the casing, together with the circuit board. The filter component is housed in the protruding part which protrudes from the flat surface toward the fin. As a result of this, the circuit board and the power component are cooled by the fin provided on a rear side of the flat surface, so that effects of dissipating heat from electronic components are maintained. Also, because of a configuration of the power supply device in which the filter component is housed in the protruding part, a noise from the power component can be prevented from arriving at the filter component, so that influences of noise generated in the device can be reduced. Further, there is no need to provide an additional shield or the like in order to reduce a noise received by the filter component. Moreover, because of a configuration in which the filter component which is likely to be increased in size is housed in the protruding part, miniaturization of the device can be achieved.

Also, a lead component can be further housed in the protruding part.

Because of a configuration in which also the lead component is housed in the protruding part of the base plate, influences of noise can be further reduced.

Also, at least a part of the fin can be configured to extend in a direction in which the fin does not interfere with the protruding part.

In a case where the fin extends in a direction in which the fin does not interfere with the protruding part, movement of air along the fin can be prevented from being hampered by the protruding part, so that cooling effects on a rear side of the flat surface of the power supply device, which are produced by the fin, can be enhanced.

According to the present invention, a power supply device which can achieve heat dissipation from mounted electronic components, reduction of influences of noise generated in the power supply device, and miniaturization of the device, is provided.

DETAILED DESCRIPTION

An embodiment for carrying out the present invention will be described below in detail with reference to accompanying drawings. Regarding description of the drawings, the same elements will be denoted by the same reference symbols, and duplicated description will be avoided.

Figure 1:
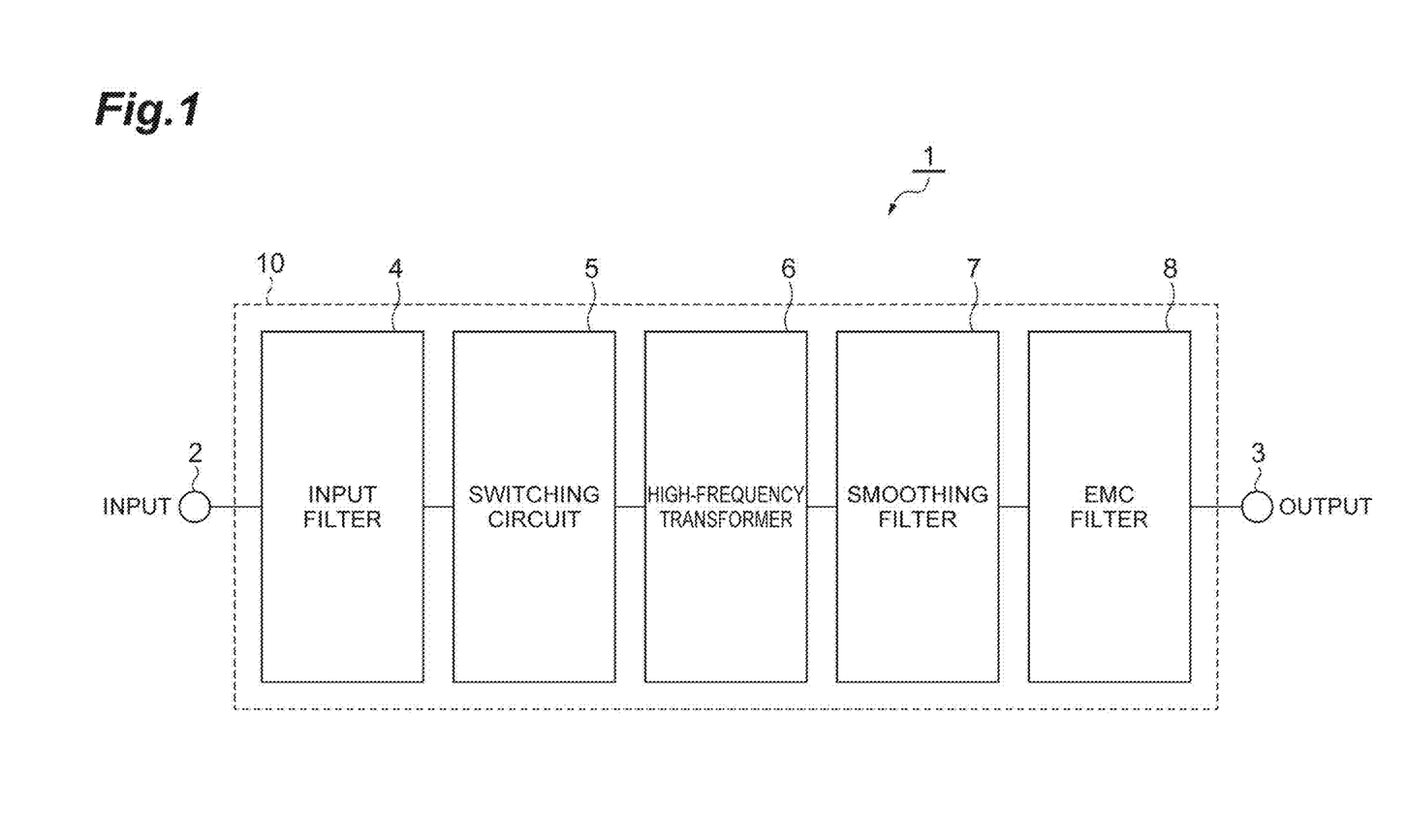
FIG. 1 is a block diagram showing a functional configuration of a power supply device according to an embodiment of the present invention.
Figure 2:
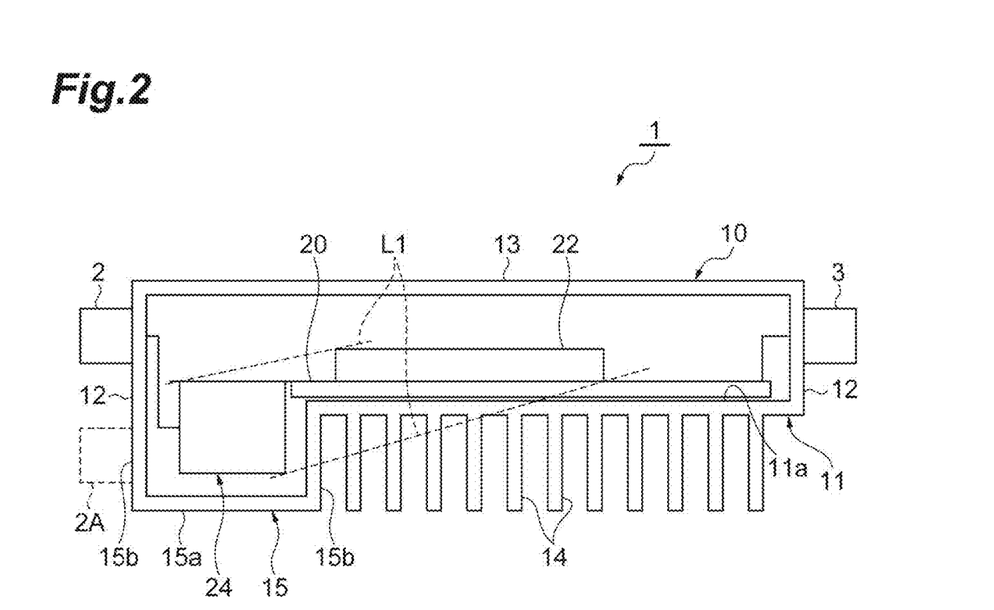
FIG. 2 is a schematic cross-sectional view showing arrangement of respective elements in the power supply device according to the embodiment.
Figure 3:
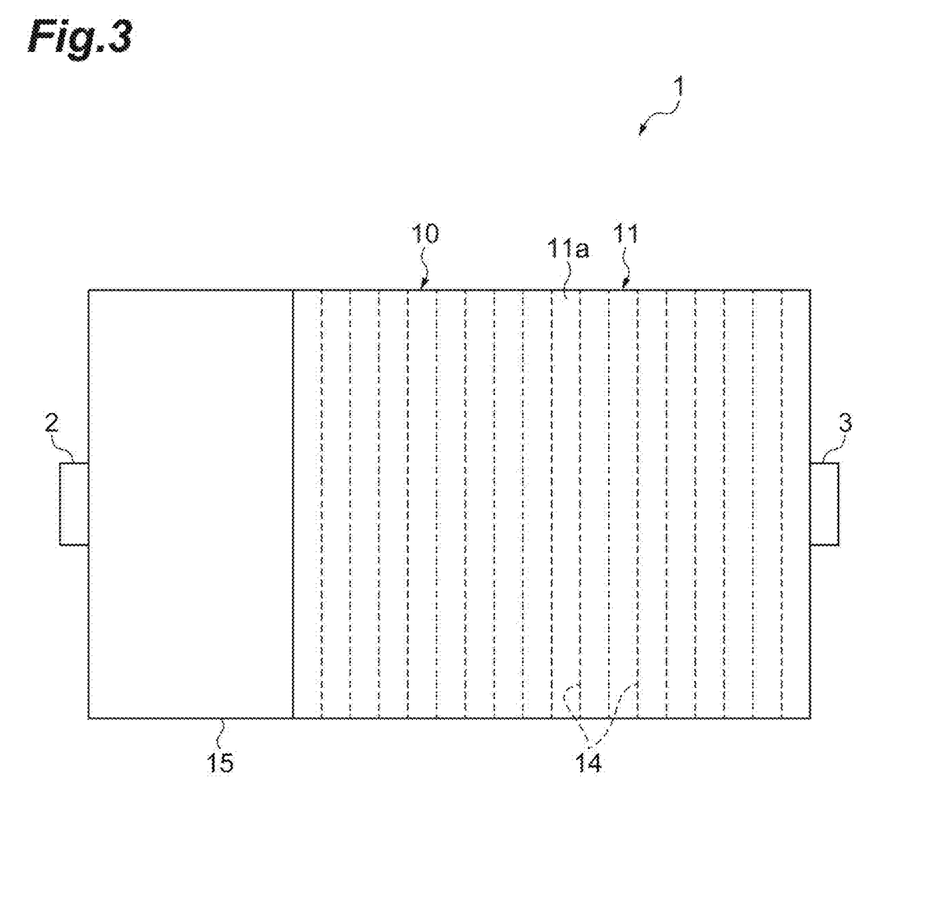
FIG. 3 is a bottom view of the power supply device according to the embodiment.

FIG. 1 is a block diagram showing a functional configuration of a power supply device according to an embodiment of the present invention. A power supply device 1 described in the present embodiment is a switching power supply device or the like which performs voltage conversion (stepdown) on a direct-current voltage which is input from a high-pressure battery connected to an input terminal, and produces a desired direct-current output voltage, for example. Also, FIG. 2 is a schematic cross-sectional view showing arrangement of respective elements in the power supply device 1, and FIG. 3 is a bottom view of the power supply device 1.

As shown in FIG. 1, the power supply device 1 includes an input filter 4, a switching circuit 5, a high-frequency transformer 6, a smoothing filter 7, and an EMC filter 8 between an input terminal 2 and an output terminal 3. The input filter 4, the switching circuit 5, the high-frequency transformer 6, the smoothing filter 7, and the EMC filter 8 are formed by combinations of electronic components and a circuit board. For example, the input filter 4 includes a choke coil and the like. The switching circuit 5 includes a switching element of a transistor or the like. The high-frequency transformer 6 includes a transformer core, an inductor, and the like. The smoothing filter 7 includes a rectifier circuit element, a choke coil or an electrolytic capacitor, and the like. Also, the EMC filter 8 includes a capacitor for a noise filter, and the like. Further, the input filter 4, the switching circuit 5, the high-frequency transformer 6, the smoothing filter 7, and the EMC filter 8 are electrically connected with each other by conductive components or the like such as a circuit pattern formed in a main circuit board (main circuit board 20 in FIG. 2) or a bus bar. When those elements operate, the power supply device 1 fulfills a desired function thereof.

Out of respective functional parts forming the power supply device 1, the input filter 4, the switching circuit 5, the high-frequency transformer 6, the smoothing filter 7, and the EMC filter 8 are housed in a casing 10. Then, the input terminal 2 and the output terminal 3 connect an inside and an outside of the casing 10, and connect the power supply device 1 and an external device.

Out of electronic components included in the respective functional parts forming the power supply device 1, electronic components included in the switching circuit 5, the high-frequency transformer 6, and the smoothing filter 7 include an electronic component which can possibly be a noise source. When a switching operation is performed in the power supply device 1, a switching noise is generated from a switching element, a rectifier circuit element, or the like in the electronic components in some cases. As such, an electronic component which can possibly generate a switching noise is an electronic component which can possibly be a noise source. In the present embodiment, such an electronic component will be referred to as a power component.

On the other hand, an electronic component which is likely to be affected when a switching noise is generated in the power supply device 1 is also included in the power supply device 1. In other words, out of electronic components included in the respective functional parts forming the power supply device 1, electronic components included in the input filter 4 and the EMC filter 8 are likely to be subjected to impairment of functions thereof due to reception of a switching noise in the power supply device 1. Each of the input filter 4 and the EMC filter 8, which is provided near the input terminal 2 or the output terminal 3, has originally a function of suppressing a noise which is transmitted on a wire extending to, or coming from, an outside. However, upon reception of a switching noise which is internally generated, each of the input filter 4 and the EMC filter 8 cannot satisfactorily fulfill a noise-suppressing function which is originally provided therein. Then, in the power supply device 1 according to the present embodiment, respective positions of an electronic component which can possibly be a noise source and an electronic component which is affected by a noise are changed, so that noise reduction in the power supply device 1 is achieved.

As shown in FIG. 2, the casing 10 forms a part of a metallic case which houses composing members of the power supply device 1. The casing 10 includes a base plate 11 forming a bottom, and side walls 12 surrounding the base plate 11. In the power supply device 1, after the above-described main circuit board 20 (circuit board) and electronic components are housed in the casing 10, the casing 10 is covered with a cover 13.

The casing 10 is made of metal such as aluminum, and has a substantially rectangular shape in plan view. Fins 14 for heat dissipation are attached to a rear side of a flat surface 11a of the base plate 11. Further, in an area different from the flat surface 11a of the base plate 11, a bottom surface protrudes toward the fins 14, so that a protruding part 15 in which a space is formed within the casing 10 is formed. The protruding part 15 includes a bottom surface 15a and a side wall 15b with which a periphery of the bottom surface 15a is covered. A part of the side wall 15b which is connected to the side walls 12 of the casing 10, forms a surface continuous with the side walls 12. Also, the bottom surface 15a of the protruding part 15 is designed so as to be at the same level as tips of the fins 14 (refer to FIG. 2). As a result of this, a sufficient volume of a space in the protruding part 15 can be ensured while an increase in size of the power supply device 1 as a whole can be avoided. Description will be made later in those respects.

Also, the input terminal 2 and the output terminal 3, by which an inside and an outside of the casing 10 communicate with each other, are attached to the side walls 12 of the casing 10. The input terminal 2 and the output terminal 3 are respectively provided on two side walls 12 which are opposite to each other along shorter dimensions, out of the side walls 12 of the casing 10 having a substantially rectangular shape in plan view. Accordingly, a flow path for electricity, which extends from the input terminal 2 on one of the two side walls 12 which are opposite to each other along shorter dimensions, to the output terminal 3 on the other of the two side walls 12, is formed in the casing 10.

As shown in FIG. 3, the fins 14 for heat dissipation in the power supply device 1 are provided so as to extend in parallel with a side wall along a shorter dimension, out of the side walls 12 of the casing 10. In the power supply device 1, air is caused to move along the fins 14 by a cooling means such as an external fan. As a result of this, air moving along the fins 14 functions as a cooling medium, so that a rear side of the flat surface 11a of the base plate 11 is cooled. Consequently, heat generated in each of electronic components of the power supply device 1 which are fixed to a front side of the base plate 11 is transferred to the base plate 11, and is dissipated to an outside from a rear side of the flat surface 11a of the base plate 11. In this way, the base plate 11 serves as a heatsink having a heat-dissipation function.

Besides, as shown in FIG. 3, the fins 14 are designed so as to extend in a direction in which the fins 14 do not interfere with the protruding part 15. That is, a direction in which the fins 14 extend is set in such a manner that movement of air which moves along the fins 14 is not hampered by the protruding part 15. Accordingly, cooling effects on a rear side of the base plate 11, which are produced by the fins 14, can be enhanced.

Referring back to FIG. 2, arrangement of respective members of the power supply device 1 which are provided in the casing 10, will be described. The main circuit board 20 is placed on the flat surface 11a of the base plate 11 in the casing 10. Also, out of electronic components connected to the main circuit board 20, an electronic component which can possibly be a noise source, that is, a power component 22, is mounted in a position on the main circuit board 20 and also on the flat surface 11a of the base plate 11. While the power component 22 can possibly be a noise source, the power component 22 is also a so-called heat generating component which is likely to have a high temperature in many cases. Thus, the power component 22 is mounted in a position on the main circuit board 20 and also on the flat surface 11a of the base plate 11. This allows heat generated in the power component 22 to be dissipated via the main circuit board 20 and the flat surface 11a of the base plate 11. Consequently, heat-dissipation performance of the power supply device 1 as a whole can be enhanced.

Also, a filter component 24 different from the power component 22 is housed in the protruding part 15 of the casing 10. As the filter component 24, the input filter 4 can be cited for example, in the present embodiment. In such a configuration, the input terminal 2 is connected to the input filter 4 in the protruding part 15 via a bus bar or the like. Also, the output terminal 3 is connected to the main circuit board 20 via a bus bar or the like.

The above-described power supply device 1 can be configured in such a manner that a component not included in the power component 22, that is, a component different from an electronic component which is a noise source, is housed in the protruding part 15, similarly to the filter component 24. As a component which can be housed in the protruding part 15, a lead component (discrete component) which is provided in a subsequent stage with respect to the input filter 4 and in a preceding stage with respect to the switching circuit 5, can be cited. If a lead component (discrete component) receives a noise from the power component 22, a conduction noise may probably be given to the filter component 24. Thus, also a lead component (discrete component) is a component which is preferably prevented from receiving a noise from the power component 22. As such, by housing a lead component (discrete component) in the protruding part 15, it is possible to achieve noise reduction. Particularly in a case where a lead component (discrete component) is taller than the other electronic components, it is useful for miniaturization of the power supply device 1 to house a lead component (discrete component) in the protruding part 15.

Effects produced by configuring the power supply device 1 according to the present embodiment in the above-described manner, will be described. As described above, in the power supply device 1, a switching noise which is generated from the power component 22 during a switching operation may probably affect the filter component 24 such as the input filter 4. In this regard, a switching noise which may probably affect the filter component 24 is mainly a radiation noise. When there is a considerable amount of radiation noise, the filter component 24 cannot satisfactorily perform filtering on a noise which is provided from the power supply device 1 to an outside, in some cases.

In an effort to prevent the filter component 24 from being affected by a radiation noise caused by the power component 22, use of a way of protecting the filter component 24 with an electromagnetic shield is considered. However, to cover some of components of the power supply device 1 with an electromagnetic shield would probably bring about an increase in size of the device. Thus, in circumstances where there is a demand for miniaturization of a device, it is not considered that to cover some of components of the power supply device 1 with an electromagnetic shield is a practical solution.

In contrast thereto, in the power supply device 1 according to the preset embodiment, the filter component 24 is housed in the protruding part 15, so that a part of the casing 10 which serves as a frame ground can function as a substitute for an electromagnetic shield. Broken lines L1 in FIG. 2 are lines connecting respective ends of the power component 22 and the filter component 24, and an area surrounded by two broken lines L1 in FIG. 2 is an area which is supposed to be a course on which a radiation noise is transferred from the power component 22 directly to the filter component 24. Then, in a part of the area surrounded by the two broken lines L1 in FIG. 2, the flat surface 11a of the base plate 11 of the casing 10 and the side wall 15b of the protruding part 15 are provided between the power component 22 and the filter component 24. Accordingly, a radiation noise is prevented from being transferred from the power component 22 directly to the filter component 24. As such, by housing the filter component 24 in the protruding part 15, it is possible to reduce a radiation noise caused by the power component 22, and suppress influences of noise upon the filter component 24.

Also, in the power supply device 1, the power component 22, in other words, a heat generating component which is likely to have a high temperature, is provided on the main circuit board 20 which is placed on the flat surface 11a of the base plate 11, so that heat can be satisfactorily dissipated from the power component 22.

Further, by housing the filter component 24 in the protruding part 15, it is possible to miniaturize the device while achieving heat dissipation from electronic components and noise reduction. In the power supply device 1, the filter component 24 is taller than the other electronic components in some cases. Thus, if the filter component 24 is mounted on the flat surface 11a of the base plate 11 of the casing 10 (or on the main circuit board 20 which is placed on the flat surface 11a of the base plate 11), there is caused a need to set a height of the side walls 12 in the casing 10 of the power supply device 1 in accordance with a height of the filter component 24 in some cases. That is, miniaturization (miniaturization particularly in a height direction; reduction in height) of the power supply device 1 is hampered due to a height of the filter component 24 in some cases.

In contrast thereto, in the power supply device 1 according to the present embodiment, the filter component 24 is housed in the protruding part 15, which eliminates a need to place the filter component 24 above the flat surface 11a of the base plate 11 in the power supply device 1, so that reduction in height can be achieved. The fins 14 which are to be provided on a rear side of the flat surface 11a of the base plate 11, are provided over a whole of a bottom surface of the casing 10 in a conventional art because a whole of a bottom surface of the casing 10 is the flat surface 11a of the base plate 11. Each of the fins 14, which is a member for forming an air passage, should have a height commensurate with a required cooling capability. In the power supply device 1 according to the present embodiment, a part of the fins 14 which are otherwise provided over a whole of a bottom surface of the casing 10, is replaced with the protruding part 15, and the filter component 24 is housed in the protruding part 15. Because of such a configuration, an upper end of the filter component 24 which is tall can be prevented from upwardly protruding from the other electronic components. Also, the bottom surface 15a of the protruding part 15 is designed so as to be at the same level as respective lower ends of the fins 14, so that an increase in size of the power supply device 1 which may be caused by provision of the protruding part 15 can be prevented.

Moreover, in the power supply device 1, the filter component 24 is housed in the protruding part 15, so that noise reduction for the filter component 24 is achieved. In a case where the filter component 24 is placed at the same level as the main circuit board 20 or the like, a shield or the like should be additionally provided in order to reduce a noise. However, in the power supply device 1, it is unnecessary to additionally provide a shield or the like. Also in this respect, miniaturization of the power supply device 1 can be achieved.

Besides, the power component 22 which is a heat generating component being strongly required to be cooled with the use of the fins 14, is provided on the main circuit board 20 placed on the flat surface 11a of the base plate 11. Accordingly, internal electronic components are prevented from being insufficiently cooled due to replacement of a part of the fins 14 with the protruding part 15. Also, the filter component 24 housed in the protruding part 15 is not a heat generating component which is more likely to have a high temperature than the other electronic components, so that heat-dissipation performance of the power supply device 1 as a whole is not affected even though the filter component 24 is not placed on a rear side of the fins 14. In the above-described manner, the power supply device 1 according to the present embodiment has a configuration in which the protruding part 15 is provided and the filter component 24 is housed in the protruding part 15, to thereby achieve miniaturization of the device while achieving heat dissipation from electronic components and noise reduction.

Also, in a case where a lead component (discrete component) is taller than the other electronic components, a lead component, as well as the filter component 24, is housed in the protruding part 15. As a result of such a configuration, further miniaturization of the device can be achieved.

Figure 4:
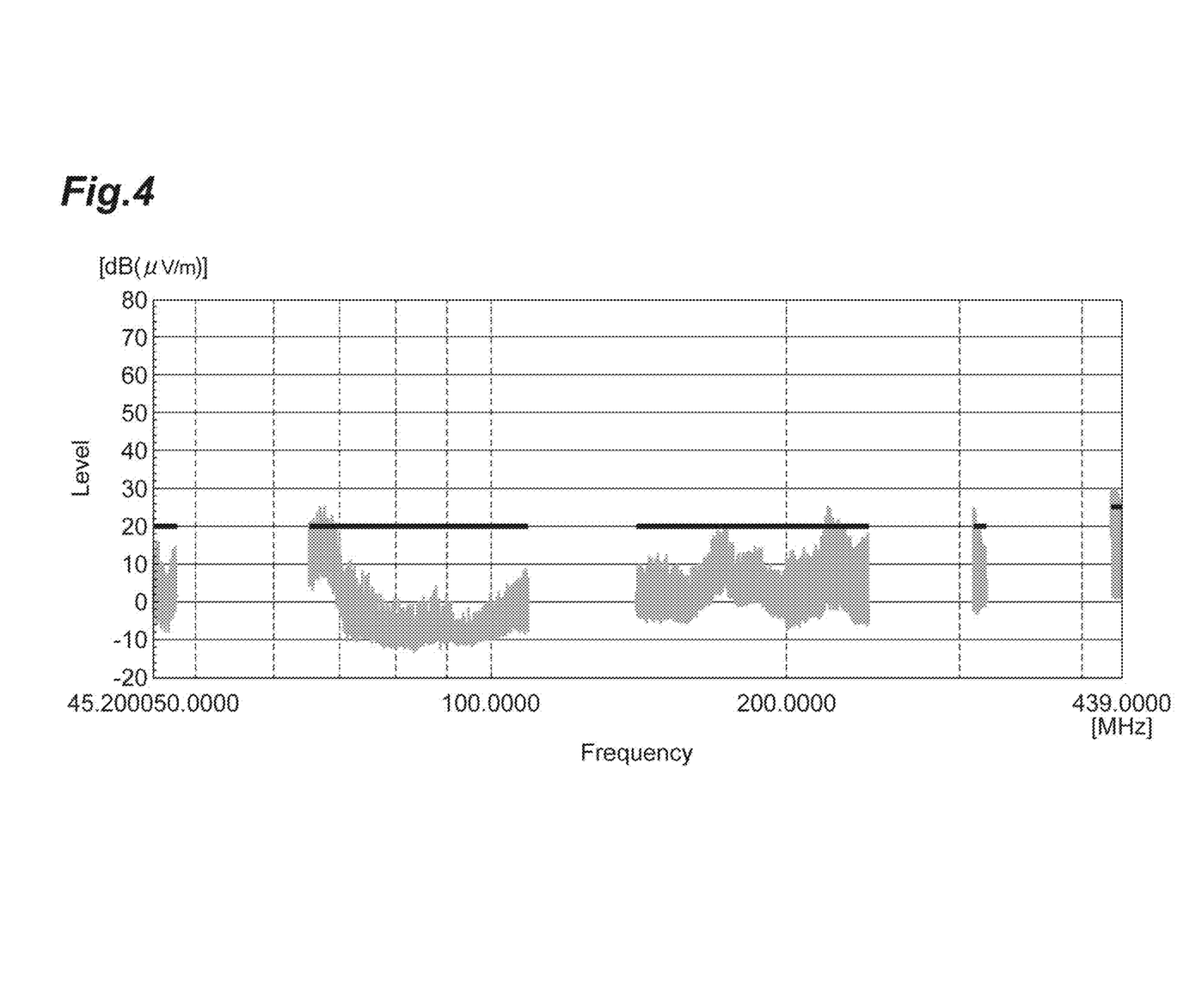
FIG. 4 shows results of measurement of noise detected by an input filter in a case where an electromagnetic shield is not provided between a power component and a filter component (input filter)
Figure 5:
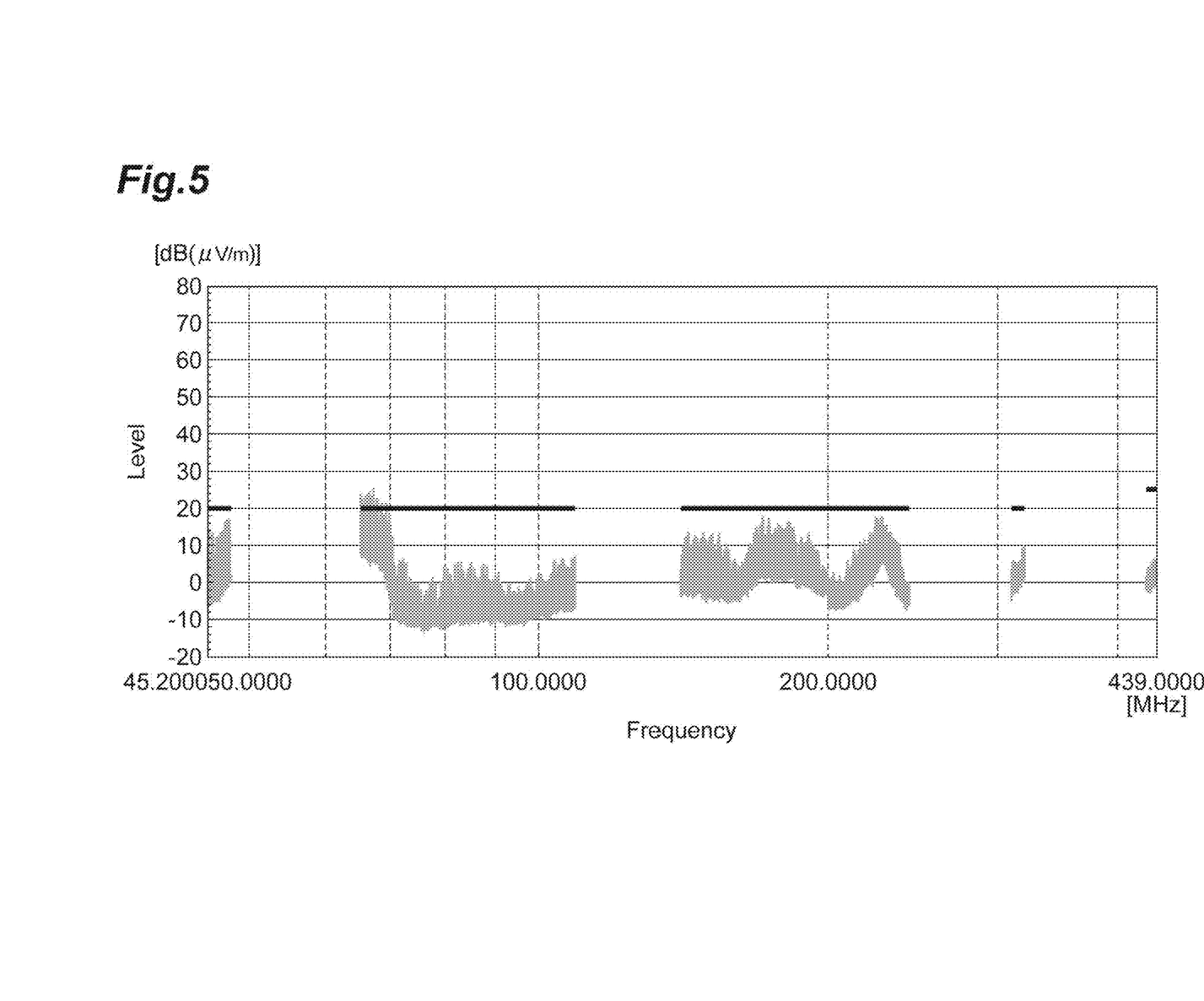
FIG. 5 shows results of measurement of noise detected by the input filter in a case where the electromagnetic shield is provided between the power component and the filter component (input filter)

Now, effects produced by provision of an electromagnetic shield in the filter component 24 will be described with reference to FIG. 4 and FIG. 5. FIG. 4 and FIG. 5 are obtained by measurement of variation in noise detected by an input filter in a case where an electromagnetic shield, that is, the base plate 11 or the protruding part 15, is provided between a power component and a filter component (input filter). FIG. 4 is obtained by measurement of noise detected by an input filter in a case where an electromagnetic shield is not provided, and FIG. 5 is obtained by measurement of noise detected in a case where a shield is provided between a power component and an input filter. FIG. 4 and FIG. 5 show results of measurement of only a noise component in a horizontal direction. It is noted that an aluminum plate with a thickness of 0.6 mm is used as each of the base plate 11, the bottom surface 15a and the side wall 15b which form the protruding part 15.

As a result of comparison between FIG. 4 and FIG. 5, it is confirmed that a noise in a frequency range higher than 200 MHz is particularly reduced by provision of the base plate 11 or the side wall 15b of the protruding part 15 as an electromagnetic shield, between the power component 22 and the filter component 24. As such, it is confirmed that a noise in the filter component 24 is reduced as a result of the filter component 24 being housed in the protruding part 15.

Besides, though the input terminal 2 which is connected to the input filter 4 included in the filter component 24 is attached to the side walls 12 of the casing 10, to be located above the main circuit board 20 in the power supply device 1, the input terminal 2 may be attached in a position of an input terminal 2A shown in FIG. 2, in other words, may be attached to the side wall 15b of the protruding part 15, to be located below the main circuit board 20. In a case where the input terminal 2 is attached in a position above the main circuit board 20, a radiation noise from the power component 22 can easily arrive at a bus bar or the like which connects the filter component 24 (input filter 4) and the input terminal 2. Thus, provision of the protruding part 15, which can reduce a radiation noise for the filter component 24 on one hand, may possibly cause influences of a radiation noise from the power component 22 to be exerted via a bus bar or the like. In view of this matter, the input terminal is attached to the side wall 15b of the protruding part 15, so that a noise for a connecting member which connects the input terminal 2 and the input filter 4 can be reduced.

Additionally, though the above-described embodiment has dealt with an example of the protruding part 15 provided in the power supply device 1, a way of placing the protruding part 15 can be appropriately changed. Below, while some modifications will be described, modifications of the power supply device 1 are not limited to the following examples.

Figure 6:
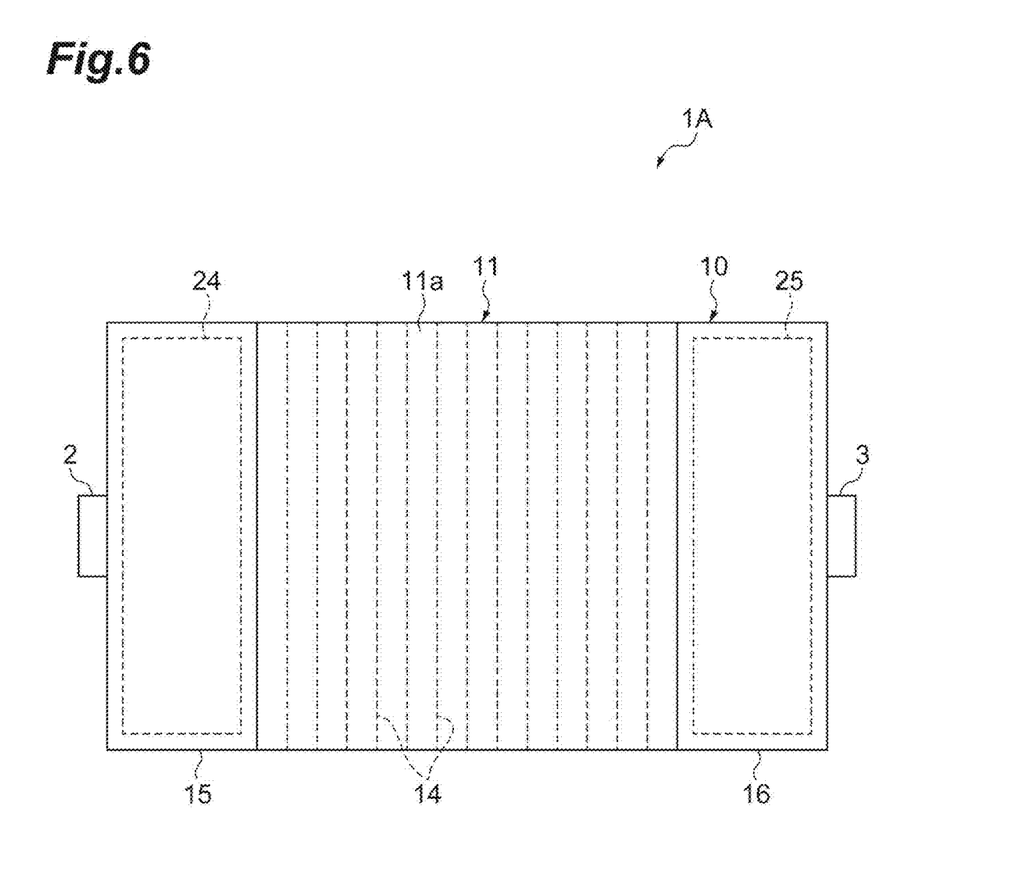
FIG. 6 is a bottom view for describing a first modification of the power supply device.

First, FIG. 6 is a bottom view of a power supply device 1A according to a first modification. The power supply device 1A is different from the power supply device 1 in that two protruding parts are provided.

The power supply device 1 includes the protruding part 15 in which the input filter 4 connected to the input terminal 2 is housed as the filter component 24, but does not have any configuration which takes into account a radiation noise for the EMC filter 8 or the like on a side where the output terminal 3 is provided. In contrast thereto, the power supply device 1A has a configuration in which a protruding part 16 is further provided on a side where the output terminal 3 is provided, so that while the input filter 4 or the like on a side where the input terminal 2 is provided is housed as the filter component 24 in the protruding part 15, the EMC filter 8 or the like on a side where the output terminal 3 is provided is housed as a filter component 25 in the protruding part 16. As the filter component 25 on a side where the output terminal 3 is provided, a choke coil, a capacitor and the like can be cited. If a lead component (discrete component) such as an electrolytic capacitor is included in the EMC filter 8, the power supply device 1A can be configured in such a manner that such a component is housed in the protruding part 16. The flat surface 11a of the base plate 11 in which the fins 14 are attached to a rear surface thereof, is provided between the protruding part 15 and the protruding part 16 in the same manner as in the power supply device 1. As a result of this, heat can be suitably dissipated from the power component 22 on the main circuit board 20. Also, because of a configuration in which the filter components 24, 25 are housed in the protruding parts 15, 16, respectively, a radiation noise which is received by the filter components 24, 25 from the power component 22 can be reduced. Also, like the power supply device 1, the power supply device 1A as a whole can be miniaturized.

Figure 7:
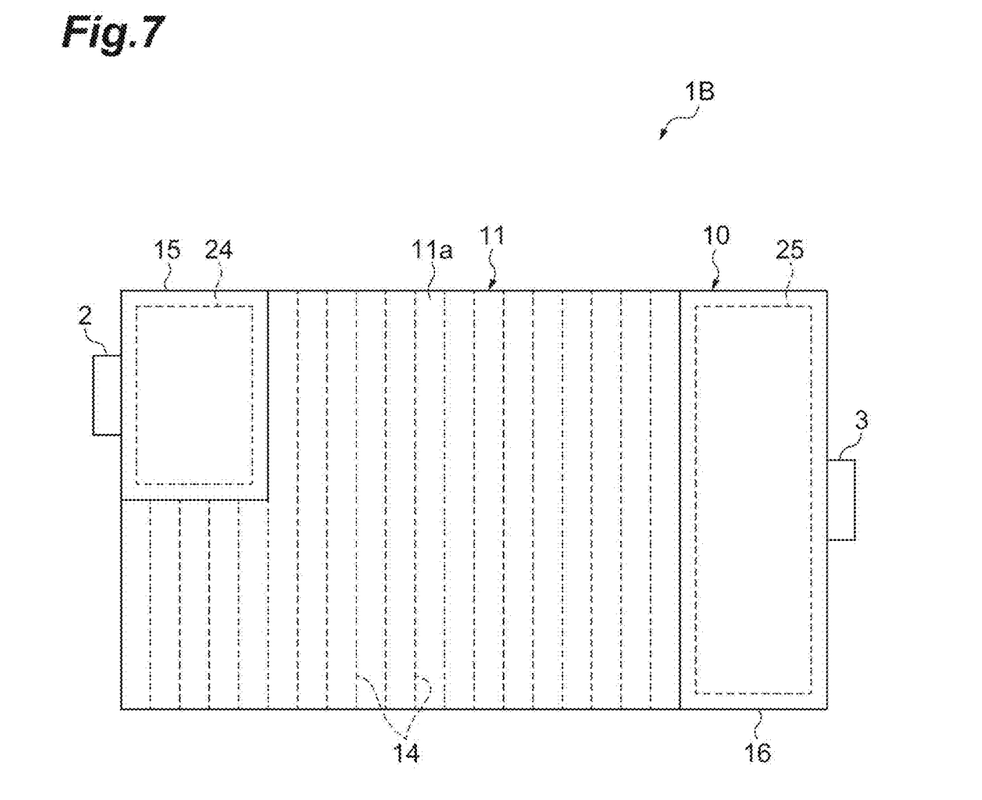
FIG. 7 is a bottom view for describing a second modification of the power supply device.

FIG. 7 is a bottom view of a power supply device 1B according to a second modification. The power supply device 1B is similar to the power supply device 1A in that two protruding parts are provided, but is different from the power supply device 1A in a shape of the protruding part 15.

For example, in a case where the filter component 24 which is to be housed in the protruding part 15 is small, a size of the protruding part 15 can be reduced as in the power supply device 1B. In this case, to change a position where the input terminal 2 is attached in accordance with the protruding part 15 could shorten a length of a member connecting the filter component 24 (input filter 4) and the input terminal 2. The protruding parts 15, 16 can be placed near the input terminal 2 or the output terminal 3 because each of the protruding parts 15, 16 has a function of housing a component provided in a subsequent stage with respect the input terminal 2 or a component provided in a preceding stage with respect to the output terminal 3, as described above. The flat surface 11a of the base plate 11 is enlarged to be formed in an area obtained by size reduction of the protruding part 15, and a component different from the filter components 24, 25 is mounted on the flat surface 11a of the base plate 11. The fins 14 are formed also on a rear side of an added part of the flat surface 11a of the base plate 11, which is enlarged, and cool a rear side of the base plate 11. In this example, as shown in FIG. 7, the protruding part 15 is provided in a direction in which the fins 14 extend in some cases. If the protruding part 15 is provided in a direction in which the fins 14 extend, movement of a part of air which moves along the fins 14 is retarded by the protruding part 15. In such an area, cooling performance provided by air cooling cannot be satisfactorily delivered, as compared to an area where the fins 14 and the protruding part 15 do not interfere with each other. Thus, a heat generating component such as the power component 22 is placed in an area different from an area in which the fins 14 and the protruding part 15 interfere with each other, in other words, in an area in which the fins 14 and the protruding part 15 do not interfere with each other, so that satisfactory cooling performance of the device as a whole can be ensured.

Figure 8:
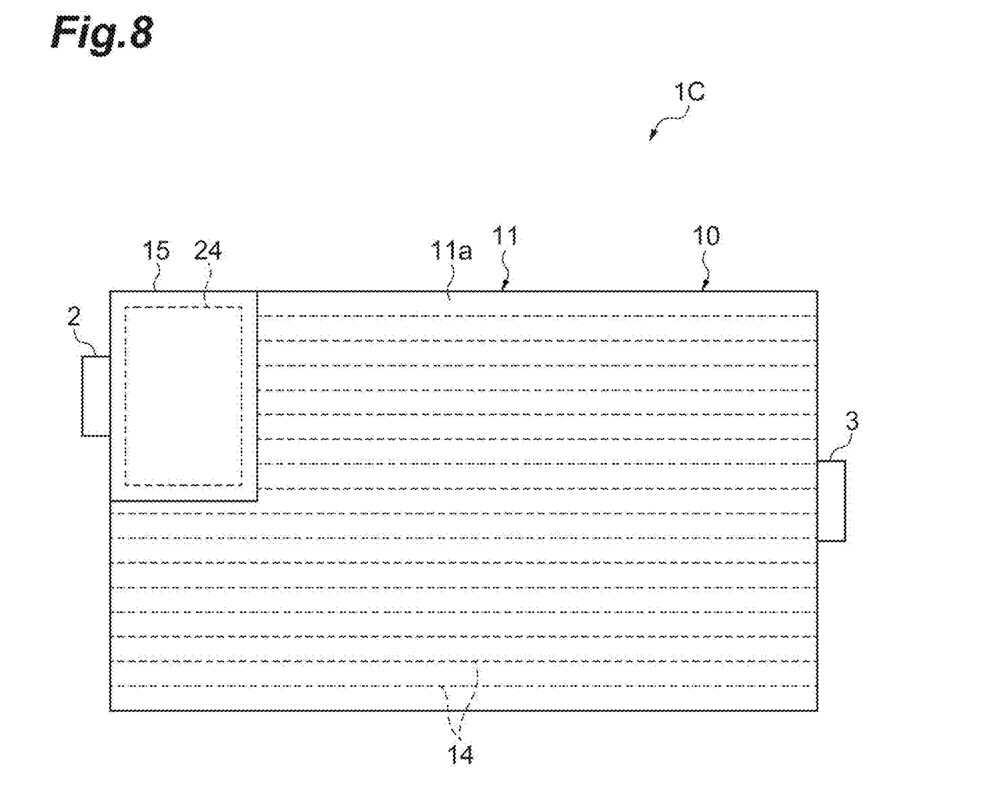
FIG. 8 is a bottom view for describing a third modification of the power supply device.

FIG. 8 is a bottom view of a power supply device 1C according to a third modification. The power supply device 1C is similar to the power supply device 1B in that the protruding part 15 is reduced in size, but is different from the power supply device 1B in that the protruding part 16 is not provided, and in a direction in which the fins 14 extend.

In the power supply device 1C, the fins 14 are provided so as to extend in parallel with a side wall along a longer dimension, out of the side walls 12 of the casing 10. Accordingly, air blown by a cooling means such as an external fan or the like moves in a lengthwise direction of the casing 10. As such, a direction in which the fins 14 extend is not limited to a specific direction, and can be appropriately changed. Also, even in a case where a direction in which the fins 14 extend is changed as in the power supply device 1C, it is possible to ensure satisfactory heat-dissipation performance of the device as a whole by placing a heat generating component such as the power component 22 in an area where the fins 14 and the protruding part 15 do not interfere with each other.

While the power supply devices according to one embodiment of the present invention have been described hereinabove, the present invention is not limited to the above-described embodiment.

For example, though the above-described embodiment has dealt with a case where only a single circuit board (main circuit board 20) is housed in the casing 10, the power supply device 1 may include a plurality of circuit boards. In such a case, the power component 22 can be connected to any of the plurality of circuit boards. Also, though the above-described embodiment has dealt with a case where the power component 22 is mounted onto the main circuit board 20, there can be provided a configuration in which the power component 22 is not mounted on the main circuit board 20.

Further, though the above-described embodiment has dealt with a configuration in which the protruding part 15 is provided on at least a side where the input terminal 2 is provided and the filter component 24 on a side where the input terminal 2 is provided is housed in the protruding part 15, there can be provided a configuration in which only the protruding part 16 is provided on a side where the output terminal 3 is provided and the filter component 25 on a side where the output terminal 3 is provided is housed in the protruding part 16. Even in a case where a protruding part is provided on at least one of a side where the input terminal 2 is provided and a side where the output terminal 3 is provided, and only a filter component on one of the above-stated sides is housed, influences of a noise can be reduced. Thus, it is possible to attain a power supply device which can achieve heat dissipation from mounted electronic components, reduction of influences of noise generated in the power supply device, and miniaturization of the device.

Moreover, though the above-described embodiment has dealt with a configuration in which most of the filter component 24 is housed in the protruding part 15, it is possible to attain a power supply device which can achieve reduction of influences of noise and miniaturization of the device so long as at least a part of the filter component 24 is housed in the protruding part 15.

What is claimed is:

1. A power supply device comprising:
    a circuit board having an upper surface and a lower surface;
    a fin for heat dissipation;
    a power component and a filter component configured to be connected to the circuit board; and
    a casing configured to house the circuit board, the power component, and the filter component, wherein
    the power component generates heat and switching noise,
    the filter component is an input filter including a choke coil or an EMC filter,
    the casing includes a base plate including an upper flat surface and a bottom surface on opposite sides of the base plate, and a protruding part which protrudes from the baseplate toward the fin, the fin being provided on the bottom surface,
    the circuit board is placed on and in direct contact with the upper flat surface, the circuit board being located between the power component and the base plate, with the power component mounted on the upper surface of the circuit board, the filter component mounted on the lower surface of the circuit board, and, in plan view, the power component facing the fin via the circuit board and the base plate so that heat generated by the power component is dissipated by the fin, and
    the filter component is housed in the protruding part so as to be distanced from the power component and to reduce reception of the switching noise generated by the power component.

2. The power supply device according to claim 1, wherein at least a part of the fin extends in a direction in which the fin does not interfere with the protruding part.

3. The power supply device according to claim 1, wherein a portion of the base plate and a side wall portion of the casing are arranged in an area in the casing that separates the filter component and the power component so as to electromagnetically shield the filter component from the power component.

* * * * *